United States Patent
Mori

(10) Patent No.: US 10,566,950 B2
(45) Date of Patent: *Feb. 18, 2020

(54) VARIABLE FREQUENCY FILTER AND HIGH-FREQUENCY FRONT END CIRCUIT

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 51 days.

This patent is subject to a terminal disclaimer.

(21) Appl. No.: 15/913,450

(22) Filed: Mar. 6, 2018

(65) Prior Publication Data

US 2018/0198437 A1 Jul. 12, 2018

Related U.S. Application Data

(63) Continuation of application No. PCT/JP2016/069221, filed on Jun. 29, 2016.

(30) Foreign Application Priority Data

Sep. 9, 2015 (JP) .................................. 2015-177144

(51) Int. Cl.
*H03H 9/54* (2006.01)
*H04B 1/52* (2015.01)
(Continued)

(52) U.S. Cl.
CPC ............ *H03H 9/542* (2013.01); *H03H 9/605* (2013.01); *H03H 9/6483* (2013.01);
(Continued)

(58) Field of Classification Search
CPC ........ H03H 9/542; H03H 9/568; H03H 9/605; H03H 9/6483; H03H 9/72;
(Continued)

(56) References Cited

U.S. PATENT DOCUMENTS 2,222,417 A * 11/1940 Mason ................. H03H 9/0095
333/190
5,933,062 A 8/1999 Kommrusch
(Continued)

FOREIGN PATENT DOCUMENTS

| JP | 2013-225945 A | 10/2013 |
| WO | 2015/119177 A1 | 8/2015 |
| WO | 2015/119179 A1 | 8/2015 |

OTHER PUBLICATIONS

International Search Report for International Application No. PCT/JP2016/069221 dated Sep. 20, 2016.
(Continued)

*Primary Examiner* — Barbara Summons
(74) *Attorney, Agent, or Firm* — Pearne & Gordon LLP

(57) ABSTRACT

A variable frequency filter includes a series arm resonant circuit and first and second parallel arm resonant circuits. The series arm resonant circuit is connected between a first connection terminal and a second connection terminal. The first parallel arm resonant circuit is connected to the first connection terminal side of the series arm resonant circuit. In the first parallel arm resonant circuit, a first piezoelectric resonator and a variable capacitor are connected in series to each other. The second parallel arm resonant circuit is connected to the second connection terminal side of the series arm resonant circuit. In the second parallel arm resonant circuit, a second piezoelectric resonator and a variable capacitor are connected in series to each other. The impedance of the first piezoelectric resonator is lower than the impedance of the second piezoelectric resonator. The series arm resonant circuit includes a characteristic adjusting capacitor at the first connection terminal side.

10 Claims, 11 Drawing Sheets

(51) Int. Cl.
*H04B 1/58* (2006.01)
*H04B 1/04* (2006.01)
*H04B 1/18* (2006.01)
*H03H 9/60* (2006.01)
*H03H 9/64* (2006.01)
*H03H 7/01* (2006.01)

(52) U.S. Cl.
CPC ............. *H04B 1/0458* (2013.01); *H04B 1/18* (2013.01); *H04B 1/52* (2013.01); *H04B 1/58* (2013.01); *H03H 7/0115* (2013.01); *H03H 7/1758* (2013.01); *H03H 7/1766* (2013.01); *H03H 7/1775* (2013.01); *H03H 2210/025* (2013.01); *H03H 2210/026* (2013.01)

(58) Field of Classification Search
CPC ....... H03H 2210/025; H03H 2210/026; H03H 7/0115; H03H 7/1725; H03H 7/1758; H03H 7/1766; H03H 7/1775; H04B 1/0458; H04B 1/18; H04B 1/52; H04B 1/58

USPC .................................. 333/133, 193–196, 189
See application file for complete search history.

(56) References Cited

U.S. PATENT DOCUMENTS

| | | | | |
|---|---|---|---|---|
| 7,030,718 | B1* | 4/2006 | Scherer | H03J 3/20 331/117 R |
| 10,284,163 | B2* | 5/2019 | Mori | H03H 7/075 |
| 2012/0286900 | A1 | 11/2012 | Kadota et al. | |
| 2016/0344092 | A1 | 11/2016 | Ogami | |
| 2016/0344364 | A1 | 11/2016 | Ogami et al. | |
| 2018/0198474 | A1* | 7/2018 | Obiya | H04B 1/00 |

OTHER PUBLICATIONS

Written Opinion for International Application No. PCT/JP2016/069221 dated Sep. 20, 2016.

* cited by examiner

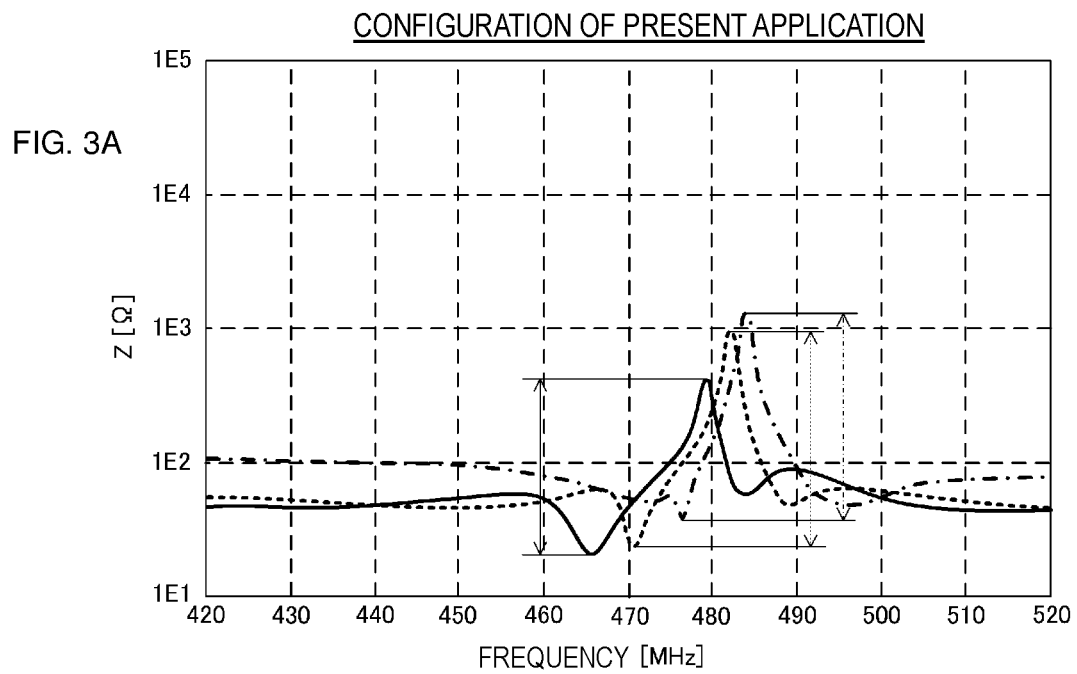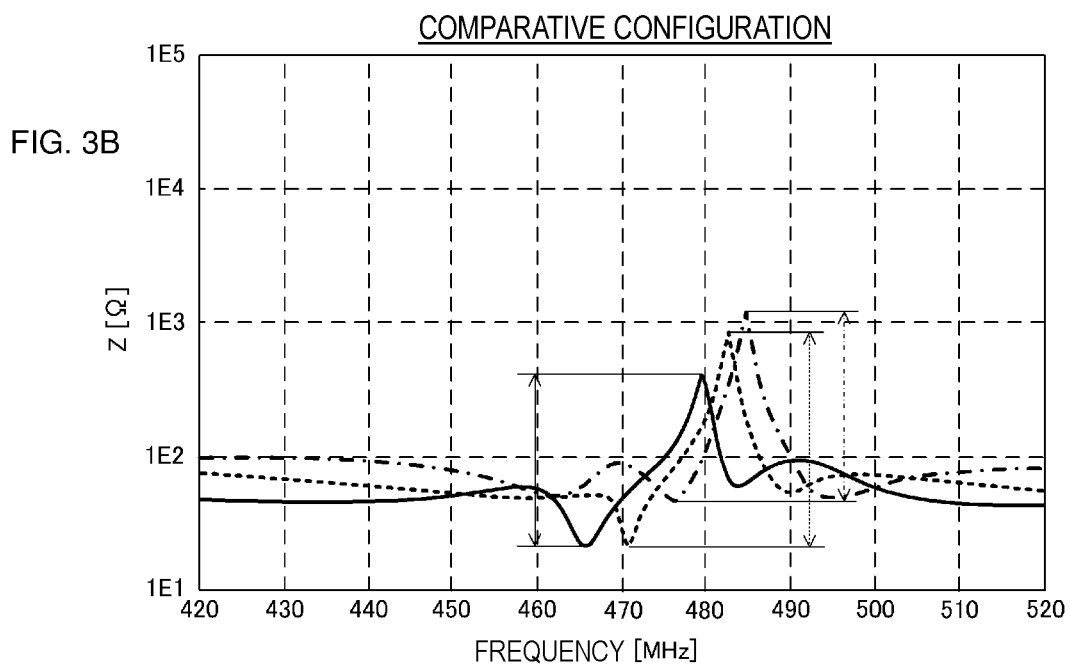

VARIABLE FREQUENCY FILTER AND HIGH-FREQUENCY FRONT END CIRCUIT

This is a continuation of International Application No. PCT/JP2016/069221 filed on Jun. 29, 2016 which claims priority from Japanese Patent Application No. 2015-177144 filed on Sep. 9, 2015. The contents of these applications are incorporated herein by reference in their entireties.

BACKGROUND

Technical Field

The present disclosure relates to a variable frequency filter including a resonator and a variable capacitor and a high-frequency front end circuit including the variable frequency filter.

Various variable frequency filters using resonators and variable capacitors are in practical use. For example, a variable frequency filter described in Patent Document 1 includes multiple parallel resonant circuits. A resonator is connected in parallel to a variable capacitor in each parallel resonant circuit.

The parallel resonant circuits of multiple steps are connected between a first terminal and a second terminal as series arm resonant circuits and parallel arm resonant circuits. For example, a series arm resonant circuit, a parallel arm resonant circuit, and a series arm resonant circuit are sequentially ladder-connected to each other from the first terminal side to the second terminal. The connection of such series arm resonant circuits and parallel arm resonant circuits of a desired number of steps realizes desired filter characteristics.

Patent Document 1: Japanese Unexamined Patent Application Publication No. 2013-225945

BRIEF SUMMARY

In order to improve attenuation characteristics in the variable frequency filter in which the series arm resonant circuits and the parallel arm resonant circuits of a certain number of steps are connected to each other, the series arm resonant circuit or the parallel arm resonant circuit is additionally connected in related art. Accordingly, the circuit size of the variable frequency filter is increased.

The present disclosure provides a variable frequency filter that has a simple configuration and that has excellent filter characteristics.

The present disclosure provides a variable frequency filter including an input terminal, an output terminal, a series arm resonant circuit, and first and second parallel arm resonant circuits. The series arm resonant circuit is connected in series between the input terminal and the output terminal. Both ends of the first parallel arm resonant circuit are one end of the series arm resonant circuit and ground potential. Both ends of the second parallel arm resonant circuit are the other end of the series arm resonant circuit and the ground potential. The series arm resonant circuit includes a fixed capacitor having fixed capacitance. The series arm resonant circuit, the first parallel arm resonant circuit, and the second parallel arm resonant circuit each include a variable capacitor, an inductor, and an elastic wave resonator. The variable capacitor, the inductor, and the elastic wave resonator are connected in parallel to each other in the series arm resonant circuit. The variable capacitor, the inductor, and the elastic wave resonator are connected in series to each other in the first parallel arm resonant circuit and the second parallel arm resonant circuit. The fixed capacitor is connected to the parallel arm resonant circuit side including the elastic wave resonator having lower impedance, among impedance of the elastic wave resonator in the first parallel arm resonant circuit and impedance of the elastic wave resonator in the second parallel arm resonant circuit, in the series arm resonant circuit.

With the above configuration, it is possible to vary the frequency of a pass band while keeping the sharpness of the attenuation characteristics at the high frequency side and the low frequency side of the pass band with the above circuits.

In the variable frequency filter of the present disclosure, one common variable capacitor can be used as the variable capacitor in the first parallel arm resonant circuit and the variable capacitor in the second parallel arm resonant circuit.

With the above configuration, the variable frequency filter is further simplified. In addition, the resonance point of the first parallel arm resonant circuit is coupled to the resonance point of the second parallel arm resonant circuit to improve the attenuation characteristics at the low frequency side of the pass band.

The variable frequency filter of the present disclosure can have the following configuration. The first parallel arm resonant circuit includes multiple inductors or a transmission line selectively connected in series to the elastic wave resonator and the variable capacitor in the first parallel arm resonant circuit. The second parallel arm resonant circuit includes multiple inductors or a transmission line selectively connected in series to the resonator and the variable capacitor in the second parallel arm resonant circuit. The series arm resonant circuit includes multiple inductors or a transmission line selectively connected in parallel to the elastic wave resonator and the variable capacitor in the series arm resonant circuit.

With the above configuration, a so-called extending inductor is capable of being selected in the series arm resonant circuit, the first parallel arm resonant circuit, and the second parallel arm resonant circuit to widen the variable frequency width.

The variable frequency filter of the present disclosure may have the following configuration. The variable frequency filter further includes a second fixed capacitor. The second fixed capacitor is connected to an end portion in the series arm resonant circuit, the end portion being connected to the parallel arm resonant circuit including the elastic wave resonator having higher impedance, among the impedance of the elastic wave resonator included in the first parallel arm resonant circuit and the impedance of the elastic wave resonator included in the second parallel arm resonant circuit, through the second fixed capacitor. The capacitance of the fixed capacitor is lower than capacitance of the second fixed capacitor.

Also with the above configuration, it is possible to vary the frequency of the pass band while keeping the sharpness of the attenuation characteristics at the high frequency side and the low frequency side of the pass band.

The present disclosure provides a high-frequency front end circuit that selects a used channel from free communication channels in multiple communication channels in a communication band composed of the multiple communication channels within a certain frequency band used in a system to perform wireless communication. The high-frequency front end circuit has the following features. The high-frequency front end circuit includes a fixed filter that attenuates a high-frequency signal outside the certain frequency band used in the system and a variable filter that attenuates a high-frequency signal of spurious waves, which are varied with the used channel and which are within the certain frequency band. The variable filter is any of the variable frequency filters described above.

With the above configuration, the high-frequency signal in the used channel is transmitted with low loss, and the high-frequency signal in the frequency band that is not in the used channel in the communication band and the frequency band outside the communication band is effectively attenuated.

The high-frequency front end circuit of the present disclosure can have the following configuration. The high-frequency front end circuit further includes a second variable filter that is composed of an LC filter of a variable frequency type and that attenuates intermodulation distortion within the certain frequency band. The second variable filter includes an input terminal, an output terminal, a first series arm LC filter circuit, and first and second parallel arm LC filter circuits. The first series arm LC filter circuit is connected between the input terminal and the output terminal. Both ends of the first parallel arm LC filter circuit are one end of the first series arm LC filter circuit and ground potential. Both ends of the second parallel arm LC filter circuit are the other end of the first series arm LC filter circuit and the ground potential. The first parallel arm LC filter circuit and the second parallel arm LC filter circuit each include a variable capacitor and an inductor, which are connected in series to each other. The first series arm LC filter circuit includes a fixed capacitor, an LC series circuit, and an LC parallel circuit. The fixed capacitor is connected in parallel to the LC series circuit. Both ends of the LC series circuit are the input terminal and the output terminal, and the LC series circuit includes a fixed capacitor and an inductor, which are connected in series to each other. The LC parallel circuit includes a variable capacitor and an inductor, which are connected in parallel to each other. The inductor included in the LC series circuit is directly connected to the output terminal or is connected to the output terminal with another inductor interposed therebetween.

With the above configuration, the insertion loss of the second variable filter is improved and the attenuation characteristics are made sharp. Accordingly, the transmission characteristics as the high-frequency front end circuit are improved.

The high-frequency front end circuit of the present disclosure can include a detecting unit that, when multiple free communication channels exist, detects a reception level of each of the multiple free communication channels and a determining unit that selects the free communication channel having the highest reception level, among the multiple detected reception levels, as the used channel.

With the above configuration, it is possible to transmit and receive the high-frequency signal using an optimal communication channel. Accordingly, the transmission characteristics of the high-frequency front end circuit are further improved.

According to the present disclosure, it is possible to realize a variable frequency filter that has a simple configuration and that has excellent filter characteristics.

BRIEF DESCRIPTION OF THE SEVERAL VIEWS OF THE DRAWINGS

FIGS. 3A and 3B include impedance characteristic diagrams illustrating how the characteristics are varied depending on the position of a characteristic adjusting capacitor in the variable frequency filter according to the first embodiment of the present disclosure.

DETAILED DESCRIPTION

Figure 1:
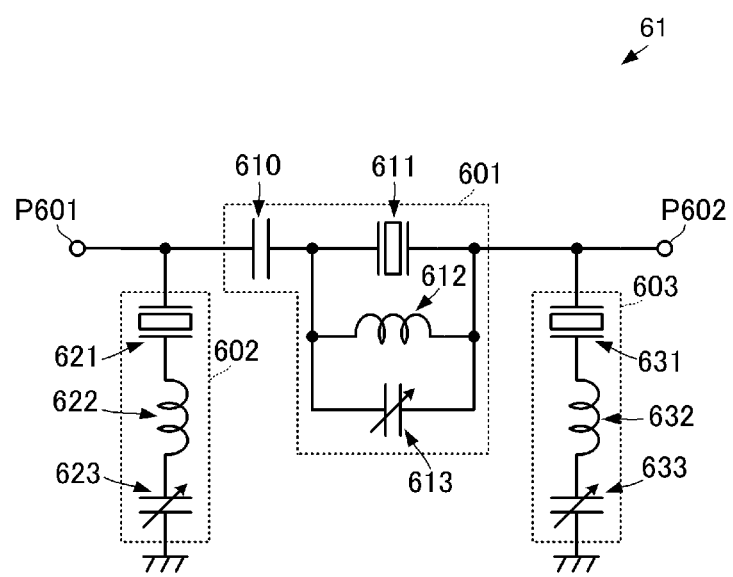
FIG. 1 is a circuit diagram of a variable frequency filter according to a first embodiment of the present disclosure.

A variable frequency filter according to a first embodiment of the present disclosure will herein be described with reference to the drawings. FIG. 1 is a circuit diagram of the variable frequency filter according to the first embodiment of the present disclosure. A piezoelectric resonator described below is, for example, a surface acoustic wave (SAW) resonator and may be another elastic wave resonator.

A variable frequency filter 61 includes a series arm resonant circuit 601, a first parallel arm resonant circuit 602, a second parallel arm resonant circuit 603, a first connection terminal P601, and a second connection terminal P602. In the variable frequency filter 61, the element values of circuit elements composing the series arm resonant circuit 601, the first parallel arm resonant circuit 602, and the second parallel arm resonant circuit 603 are set so that the impedance viewed from an external circuit toward the first connection terminal P601 side and the impedance viewed from the external circuit toward the second connection terminal P602 side are substantially equal to 50[Ω].

The series arm resonant circuit 601 is connected between the first connection terminal P601, which is an input terminal, and the second connection terminal P602, which is an output terminal. The first parallel arm resonant circuit 602 is connected between the first connection terminal P601 side of the series arm resonant circuit 601 and ground potential. The second parallel arm resonant circuit 603 is connected between the second connection terminal P602 side of the series arm resonant circuit 601 and the ground potential.

The series arm resonant circuit 601 includes a piezoelectric resonator 611, an inductor 612, a variable capacitor 613, and a characteristic adjusting capacitor 610. The characteristic adjusting capacitor 610 corresponds to a "fixed capacitor" of the present disclosure. The piezoelectric resonator 611, the inductor 612, the variable capacitor 613 are connected in parallel to each other. The inductor 612 is a so-called extending inductor for the piezoelectric resonator 611. The characteristic adjusting capacitor 610 is connected in series to the parallel circuit composed of the piezoelectric resonator 611, the inductor 612, and the variable capacitor 613. The characteristic adjusting capacitor 610 is connected to the first connection terminal P601 and the parallel circuit is connected to the second connection terminal P602. In other words, the characteristic adjusting capacitor 610 is connected to the first parallel arm resonant circuit 602 and the parallel circuit is connected to the second parallel arm resonant circuit 603.

The first parallel arm resonant circuit 602 includes a piezoelectric resonator 621, an inductor 622, and a variable capacitor 623. The piezoelectric resonator 621, the inductor 622, and the variable capacitor 623 are connected in series to each other. The inductor 622 is a so-called extending inductor for the piezoelectric resonator 621. This series circuit is connected between the first connection terminal P601 and the ground potential.

The second parallel arm resonant circuit 603 includes a piezoelectric resonator 631, an inductor 632, and a variable capacitor 633. The piezoelectric resonator 631, the inductor 632, and the variable capacitor 633 are connected in series to each other. The inductor 632 is a so-called extending inductor for the piezoelectric resonator 631. This series circuit is connected between the second connection terminal P602 and the ground potential.

The impedance of the piezoelectric resonator 621 in the first parallel arm resonant circuit 602 is lower than the impedance of the piezoelectric resonator 631 in the second parallel arm resonant circuit 603. Here, the impedance of the piezoelectric resonator 621 in the first parallel arm resonant circuit 602 is lower than the impedance of the variable frequency filter. For example, the impedance of the piezoelectric resonator 621 in the first parallel arm resonant circuit 602 is about 30[Ω] and the impedance of the piezoelectric resonator 631 in the second parallel arm resonant circuit 603 is equal to about 200[Ω]. Here, the impedance of the piezoelectric resonator 611 in the series arm resonant circuit 601 is equal to, for example, about 40[Ω].

Figure 2A:
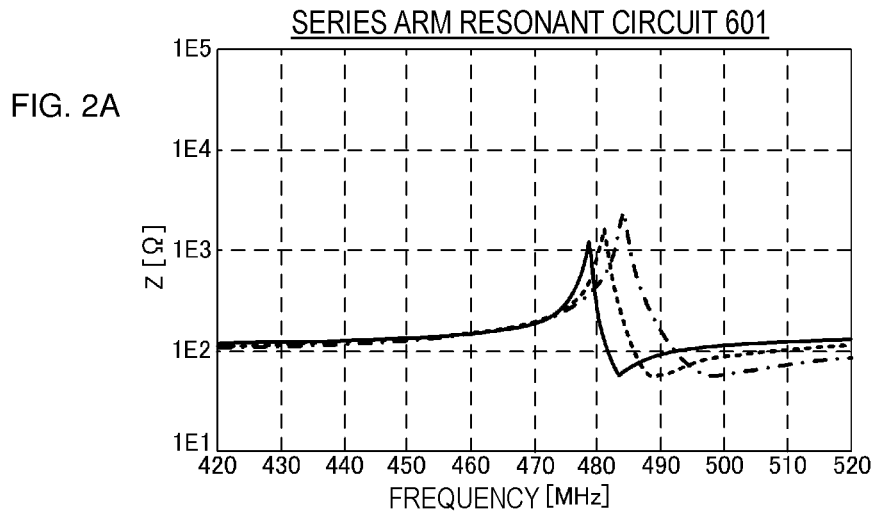
FIGS. 2A-2C include impedance characteristic diagrams of the respective resonant circuits in the variable frequency filter according to the first embodiment of the present disclosure.
Figure 2B:
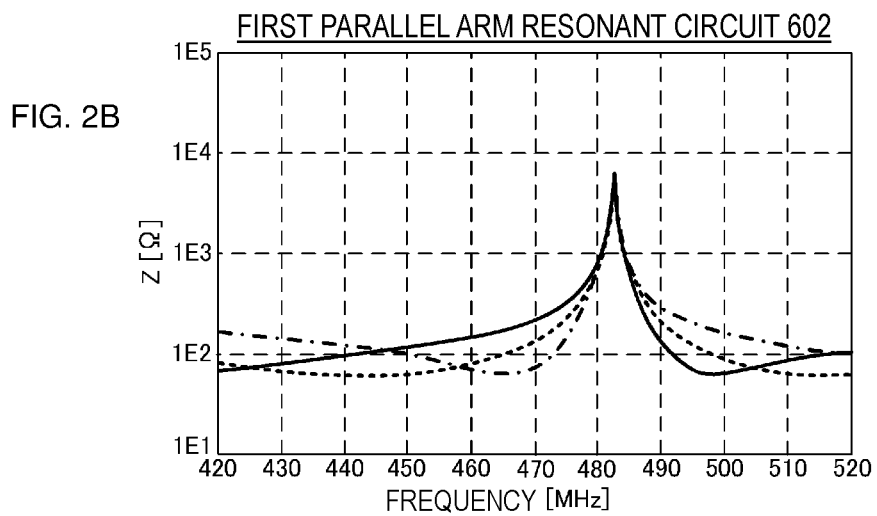
Figure 2C:
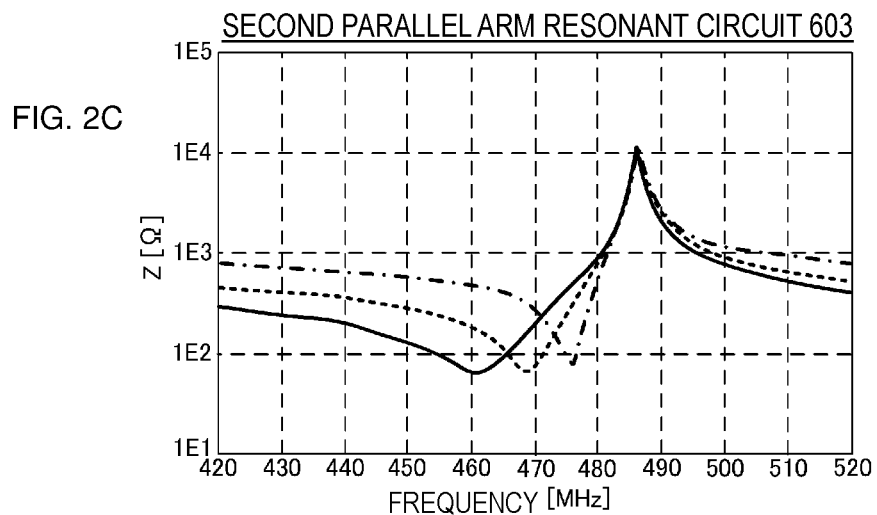

In such a configuration, the series arm resonant circuit 601 and the first and second parallel arm resonant circuits 602 and 603 have impedance characteristics illustrated in FIGS. 2A-2C. FIGS. 2A-2C include impedance characteristic diagrams of the respective resonant circuits in the variable frequency filter according to the first embodiment of the present disclosure. FIG. 2A illustrates the impedance characteristics of the series arm resonant circuit, FIG. 2B illustrates the impedance characteristics of the first parallel arm resonant circuit, and FIG. 2C illustrates the impedance characteristics of the second parallel arm resonant circuit. Referring to FIGS. 2A-2C, the respective characteristic curves indicate cases in which the capacitance of the variable capacitor is varied.

In the series arm resonant circuit 601, the impedance characteristics are determined by a combined capacitor of the variable capacitor 613 connected in parallel to the piezoelectric resonator 611 and the characteristic adjusting capacitor 610 connected in series to the piezoelectric resonator 611. Anti-resonance points and resonance points are similarly varied on the frequency axis depending on the capacitance of the variable capacitor 613 while keeping the Q values of the anti-resonance points high, as illustrated in FIG. 2A.

Since the impedance of the piezoelectric resonator 621 is low in the first parallel arm resonant circuit 602, one impedance characteristic of a characteristic A1, a characteristic B1, and a characteristic C1 is achieved depending on the capacitance of the variable capacitor 623. As illustrated in FIG. 2B, in the characteristic A1, a sub-resonance point exists near the anti-resonance point at the high frequency side and the resonance point exists at a distance at the low frequency side of the anti-resonance point. In the characteristic B1, the sub-resonance point exists at a distance at the high frequency side of the anti-resonance point and the resonance point exists at a distance at the low frequency side of the anti-resonance point. In the characteristic C1, the resonance point exists near the anti-resonance point at the low frequency side.

Since the impedance of the piezoelectric resonator 631 is high in the second parallel arm resonant circuit 603, one impedance characteristic of a characteristic A2 and a characteristic B2 is achieved depending on the capacitance of the variable capacitor 633. As illustrated in FIG. 2C, in the characteristic A2, the resonance point exists at a distance at the low frequency side of the anti-resonance point. In the characteristic B2, the resonance point exists near the anti-resonance point at the low frequency side.

In particular, the connection of the characteristic adjusting capacitor 610 at the side of the first parallel arm resonant circuit 602 including the piezoelectric resonator 621 having a low impedance achieves characteristics illustrated in FIG. 3A. FIGS. 3A and 3B include impedance characteristic diagrams illustrating how the characteristics are varied depending on the position of the characteristic adjusting capacitor in the variable frequency filter according to the first embodiment of the present disclosure. FIG. 3A illustrates a case in which the characteristic adjusting capacitor is connected to the parallel arm resonant circuit side including the piezoelectric resonator having a low impedance. FIG. 3B illustrates a case in which the characteristic adjusting capacitor is connected to the parallel arm resonant circuit side including the piezoelectric resonator having a high impedance.

In the case of the connection of the characteristic adjusting capacitor 610 to the first parallel arm resonant circuit 602 side including the piezoelectric resonator 621 having a low impedance, a Z ratio is hardly varied even if the capacitance of the variable capacitor in each resonant circuit is varied, as illustrated in FIG. 3A. In contrast, in the circuit in which the characteristic adjusting capacitor 610 is connected to the second parallel arm resonant circuit 603 side including the piezoelectric resonator 631 having a high impedance, as in a comparative example, the Z ratio may be decreased depending on the capacitance of the variable capacitor in each resonant circuit, as illustrated in FIG. 3B.

More specifically, for example, the characteristic having the highest impedance of the anti-resonance point, among the multiple impedance characteristics illustrated in FIG. 3A, is referred to as a characteristic 1. The characteristic having the highest impedance of the anti-resonance point, among the multiple impedance characteristics illustrated in FIG. 3B, is referred to as a characteristic 2. As illustrated in FIG. 3A and FIG. 3B, the ratio between the impedance of the anti-resonance point and the impedance of the resonance point in the characteristic 1 (corresponding to the range of an alternate long and short dash arrow line illustrated in FIG. 3A) is higher than the ratio between the impedance of the anti-resonance point and the impedance of the resonance point in the characteristic 2 (corresponding to the range of an alternate long and short dash arrow line illustrated in FIG. 3B). The Z ratio means the ratio between the impedance of the anti-resonance point and the impedance of the resonance point ((the impedance of the anti-resonance point)/(the impedance of the resonance point)).

Since the Q value as the resonant circuit is improved when the Z ratio is high, the circuit having the impedance characteristics illustrated in FIG. 3A has a higher Q value.

Accordingly, the connection of the characteristic adjusting capacitor to the parallel arm resonant circuit side including the piezoelectric resonator having a low impedance enables the Q value to be improved.

As described above, the use of the configuration of the present embodiment enables the frequencies of the resonance point and the anti-resonance point of each resonant circuit to be varied while keeping the Z ratio at a high value.

Figure 4:
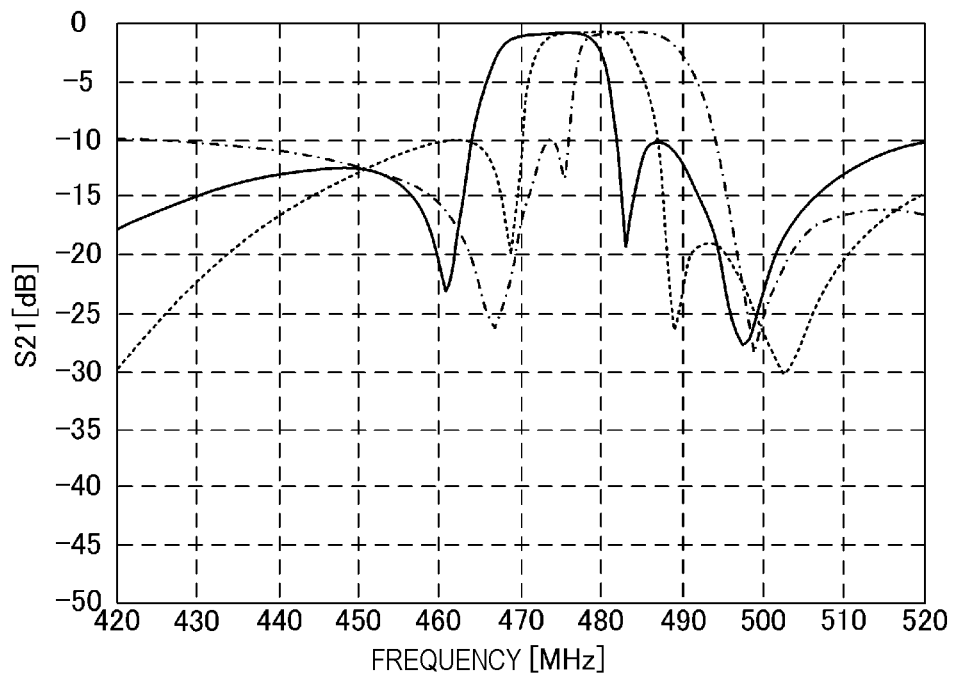
FIG. 4 is a bandpass characteristic diagram of the variable frequency filter according to the first embodiment of the present disclosure.

FIG. 4 is a bandpass characteristic diagram of the variable frequency filter according to the first embodiment of the present disclosure. The respective lines in FIG. 4 illustrate filter characteristics when the capacitance of the variable capacitor is varied. As illustrated in FIG. 4, the use of the configuration of the present embodiment realizes the variable frequency filter 61 that has bandpass characteristics with low loss and that has an excellent attenuation characteristic at the high frequency side and the low frequency side of a pass band even if the frequency of the pass band is varied. The excellent attenuation characteristic means that the attenuation characteristic forming both sides of the pass band is sharp and the attenuations at attenuation poles are large.

The use of the variable frequency filter 61 according to the present embodiment realizes the filter characteristics in which the pass band width is kept at about 10 [MHz], the attenuation on both sides of the pass band is sharp, and the attenuation poles having large attenuations exist within a range of about 10 [MHz] on both sides of the pass band even if the frequency of the pass band is varied, as illustrated in FIG. 4.

Figure 5:
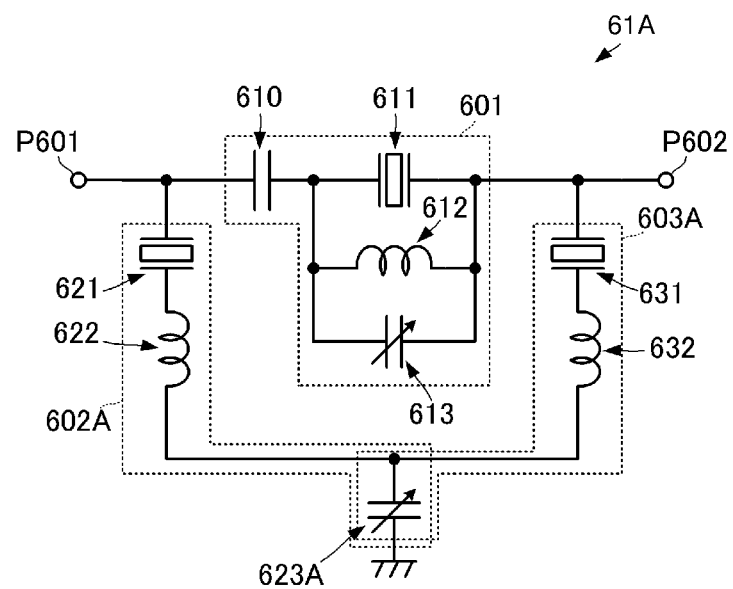
FIG. 5 is a circuit diagram of a variable frequency filter according to a second embodiment of the present disclosure.

A variable frequency filter according to a second embodiment of the present disclosure will now be described with reference to the drawings. FIG. 5 is a circuit diagram of the variable frequency filter according to the second embodiment of the present disclosure.

A variable frequency filter 61A according to the present embodiment differs from the variable frequency filter 61 according to the first embodiment in the configurations of a first parallel arm resonant circuit 602A and a second parallel arm resonant circuit 603A.

The first parallel arm resonant circuit 602A includes the piezoelectric resonator 621, the inductor 622, and a variable capacitor 623A. The second parallel arm resonant circuit 603A includes the piezoelectric resonator 631, the inductor 632, and the variable capacitor 623A. The first parallel arm resonant circuit 602A and the second parallel arm resonant circuit 603A include the variable capacitor 623A common to the first parallel arm resonant circuit 602A and the second parallel arm resonant circuit 603A in the above manner.

In such a configuration, the resonance point of the first parallel arm resonant circuit 602A is coupled to the resonance point of the second parallel arm resonant circuit 603A.

Figure 6:
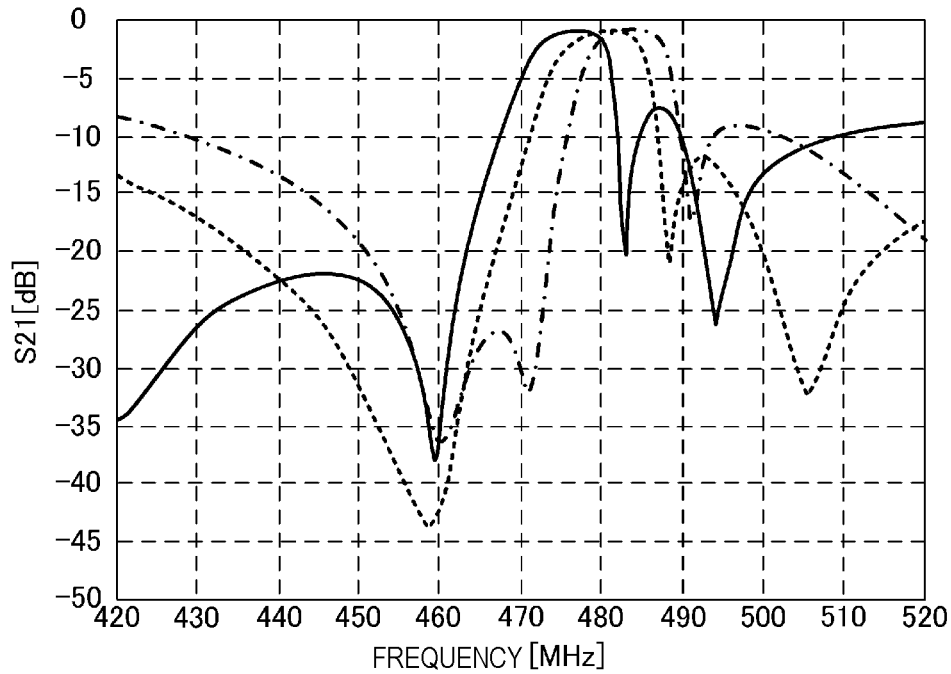
FIG. 6 is a bandpass characteristic diagram of the variable frequency filter according to the second embodiment of the present disclosure.

FIG. 6 is a bandpass characteristic diagram of the variable frequency filter according to the second embodiment of the present disclosure. As illustrated in FIG. 6, the use of the configuration of the present embodiment improves the attenuation at the attenuation pole at the low frequency side of the pass band.

Figure 7:
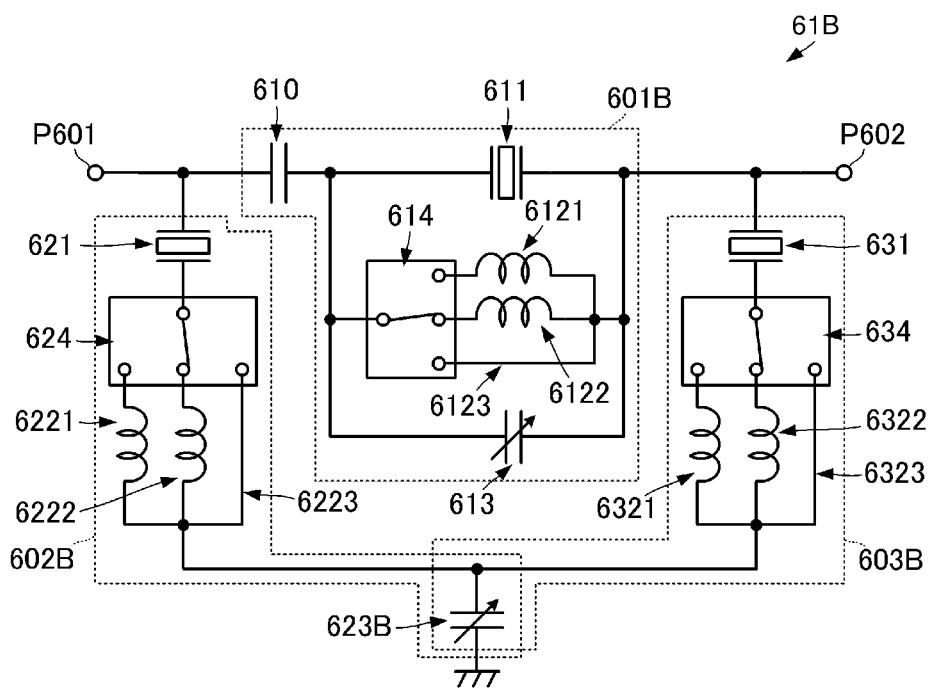
FIG. 7 is a circuit diagram of a variable frequency filter according to a third embodiment of the present disclosure.

A variable frequency filter according to a third embodiment of the present disclosure will now be described with reference to the drawings. FIG. 7 is a circuit diagram of the variable frequency filter according to the third embodiment of the present disclosure.

A variable frequency filter 61B according to the present embodiment differs from the variable frequency filter 61A according to the second embodiment in that an extending inductor in each resonant circuit is capable of being selected.

The variable frequency filter 61B includes a series arm resonant circuit 601B, a first parallel arm resonant circuit 602B, and a second parallel arm resonant circuit 603B.

The series arm resonant circuit 601B includes the piezoelectric resonator 611, inductors 6121 and 6122, the variable capacitor 613, a switch 614, and the characteristic adjusting capacitor 610. The inductors 6121 and 6122 have different inductances. One of a parallel circuit composed of the piezoelectric resonator 611, the inductor 6121, and the variable capacitor 613, a parallel circuit composed of the piezoelectric resonator 611, the inductor 6122, and the variable capacitor 613, and a parallel circuit composed of the piezoelectric resonator 611 and the variable capacitor 613 is selected using the switch 614.

The first parallel arm resonant circuit 602B includes the piezoelectric resonator 621, inductors 6221 and 6222, a variable capacitor 623B, and a switch 624. The inductors 6221 and 6222 have different inductances. One of a series circuit composed of the piezoelectric resonator 621, the inductor 6221, and the variable capacitor 623B, a series circuit composed of the piezoelectric resonator 621, the inductor 6222, and the variable capacitor 623B, and a series circuit composed of the piezoelectric resonator 621 and the variable capacitor 623B is selected using the switch 624.

The second parallel arm resonant circuit 603B includes the piezoelectric resonator 631, inductors 6321 and 6322, the variable capacitor 623B, and a switch 634. The variable capacitor 623B is shared with the first parallel arm resonant circuit 602B. The inductors 6321 and 6322 have different inductances. One of a series circuit composed of the piezoelectric resonator 631, the inductor 6321, and the variable capacitor 623B, a series circuit composed of the piezoelectric resonator 631, the inductor 6322, and the variable capacitor 623B, and a series circuit composed of the piezoelectric resonator 631 and the variable capacitor 623B is selected using the switch 634.

Figure 8A:
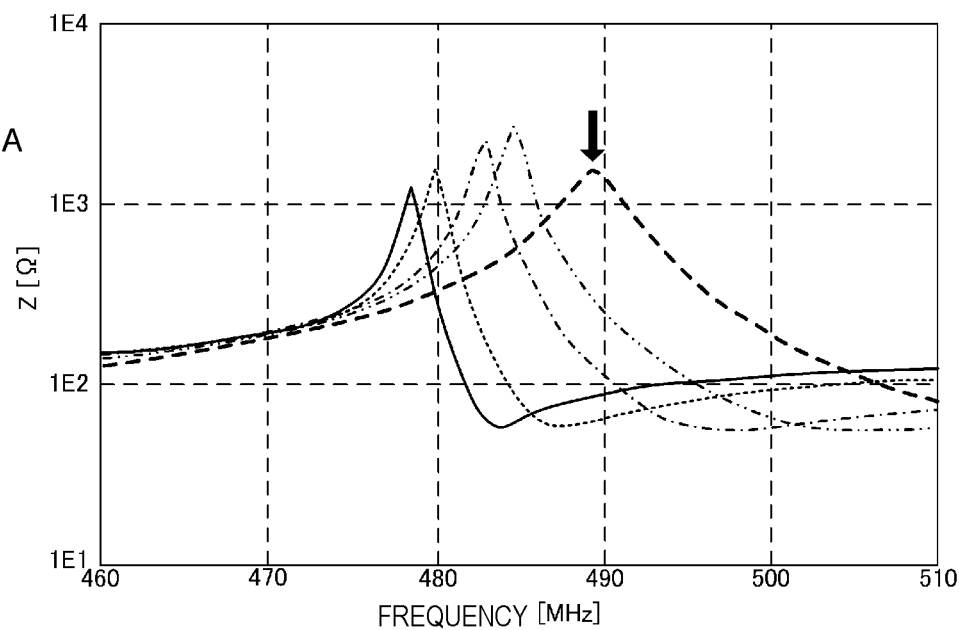
FIGS. 8A and 8B include diagrams illustrating impedance characteristics for describing the advantages of the variable frequency filter according to the third embodiment of the present disclosure.
Figure 8B:
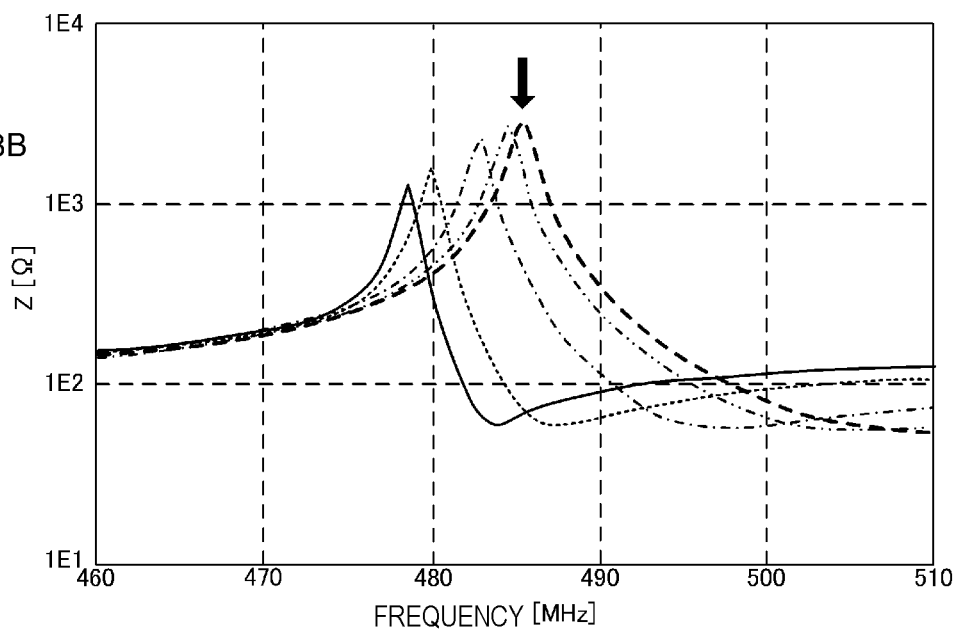

Since the inductor is capable of being selected in the series arm resonant circuit 601B, the first parallel arm resonant circuit 602B, and the second parallel arm resonant circuit 603B in the above manner, the following advantages are achieved. FIGS. 8A and 8B include diagrams illustrating impedance characteristics for describing the advantages of the variable frequency filter according to the present embodiment. FIG. 8A illustrates the impedance characteristics of the variable frequency filter of the present embodiment. FIG. 8B illustrates the impedance characteristics of a variable frequency filter in which the inductor is not selected.

Since the capacitance of the capacitor is capable of being varied or the inductance is capable of being switched using the switch in FIG. 8A, frequency bands 1 to 5 in FIG. 8A support the first to fourth frequency bands having close frequency bands and the fifth frequency band having a frequency band apart from the first to fourth frequency bands. In contrast, since only the capacitance of the capacitor is capable of being varied in FIG. 8B, all frequency bands 1 to 5 in FIG. 8B are close to each other. As described above, the variable frequency filter of the present embodiment in FIG. 7 is capable of supporting various frequency bands.

Figure 9A:
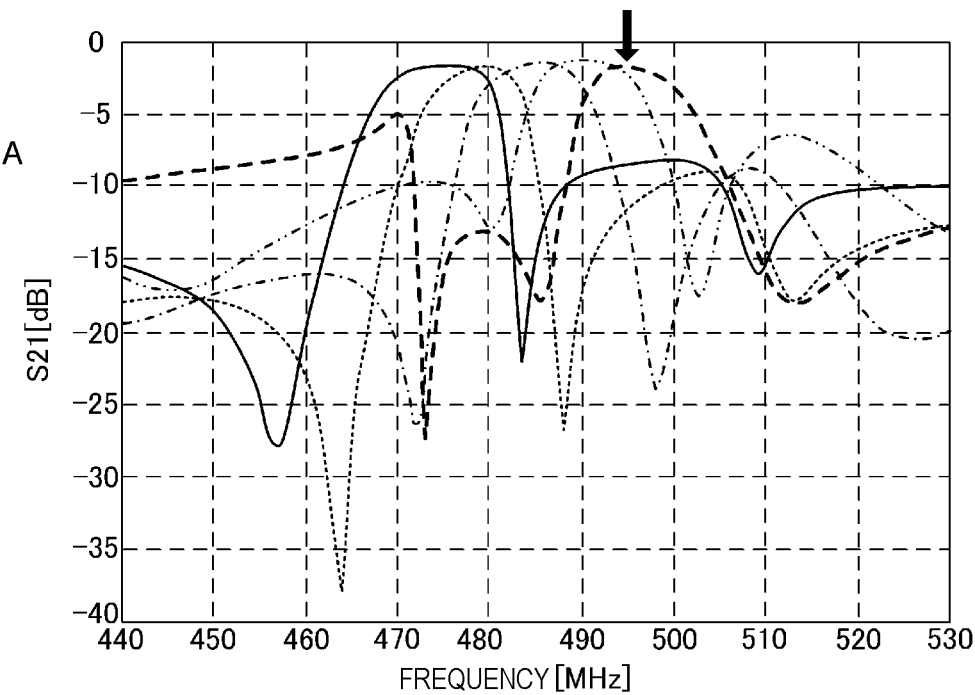
FIGS. 9A and 9B include diagrams illustrating bandpass characteristics for describing the advantages of the variable frequency filter according to the third embodiment of the present disclosure.
Figure 9B:
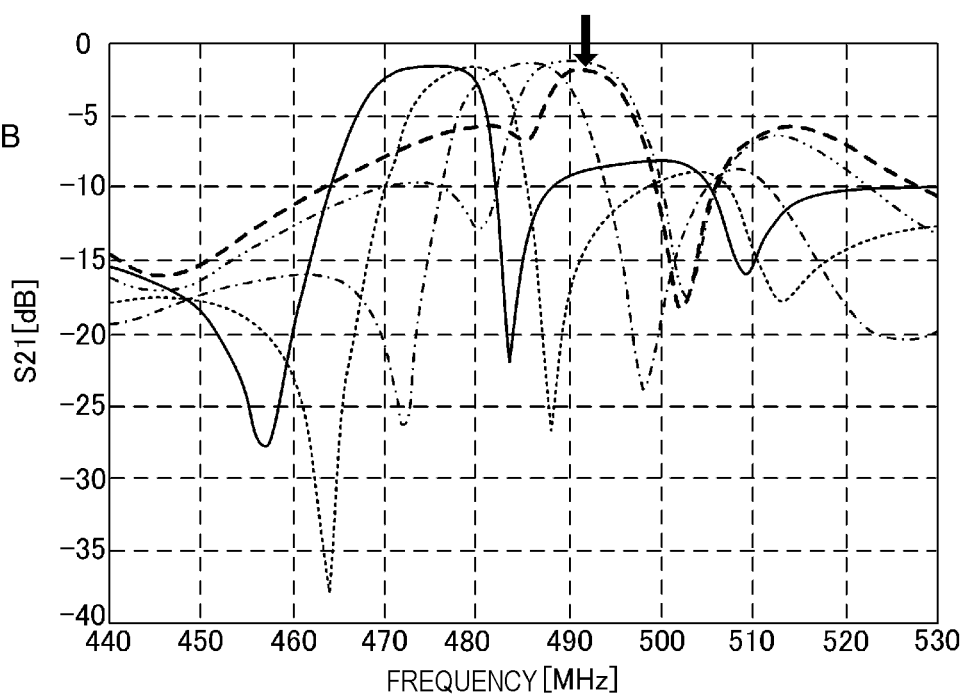

Accordingly, it is possible to set the pass bands having desired frequency band widths within a wider frequency range. FIGS. 9A and 9B include diagrams illustrating bandpass characteristics for describing the advantages of the variable frequency filter according to the present embodiment. FIG. 9A illustrates the bandpass characteristics of the variable frequency filter of the present embodiment. FIG. 9B illustrates the bandpass characteristics of a variable frequency filter in which the inductor is not selected. As illustrated in FIGS. 9A and 9B, the variable frequency filter 61B of the present embodiment is capable of widening the frequency ranges of the pass bands, compared with the variable frequency filter in a comparative example. Here, the frequency widths of the pass bands in the respective circuit configurations are substantially equal to each other and similar attenuation characteristics are capable of being achieved.

Figure 10:
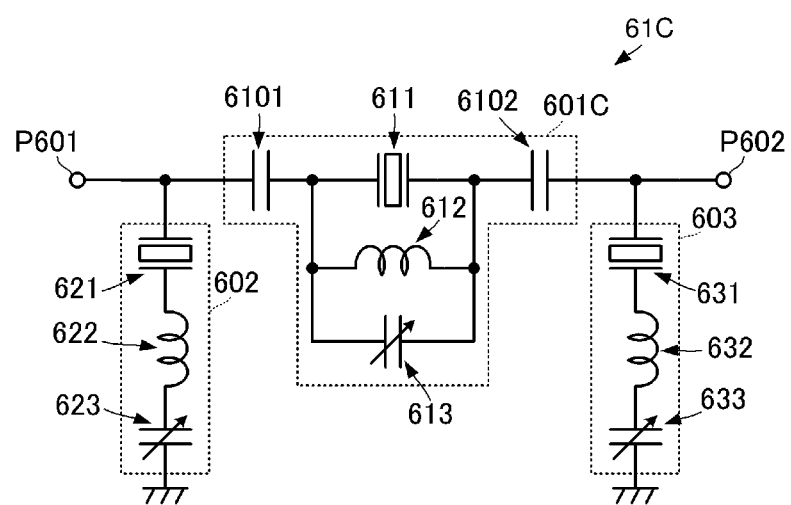
FIG. 10 is a circuit diagram of a variable frequency filter according to a fourth embodiment of the present disclosure.

A variable frequency filter according to a fourth embodiment of the present disclosure will now be described with reference to the drawing. FIG. 10 is a circuit diagram of the variable frequency filter according to the fourth embodiment of the present disclosure.

A variable frequency filter 61C according to the present embodiment differs from the variable frequency filter 61 according to the first embodiment in the configuration of a series arm resonant circuit 601C.

The series arm resonant circuit 601C includes the piezoelectric resonator 611, the inductor 612, the variable capacitor 613, and characteristic adjusting capacitors 6101 and 6102. The piezoelectric resonator 611, the inductor 612, and the variable capacitor 613 are connected in parallel to each other.

The characteristic adjusting capacitor 6101 is connected to the first connection terminal P601 side (the first parallel arm resonant circuit 602 side) of the parallel circuit. The characteristic adjusting capacitor 6102 is connected to the second connection terminal P602 side (the second parallel arm resonant circuit 603 side) of the parallel circuit. The capacitance of the characteristic adjusting capacitor 6101 is smaller than the capacitance of the characteristic adjusting capacitor 6102. In other words, the impedance of the characteristic adjusting capacitor 6101 is greater than the impedance of the characteristic adjusting capacitor 6102. The characteristic adjusting capacitor 6102 corresponds to a "second fixed capacitor" of the present disclosure.

Also with such a configuration, similar effects and advantages as those of the variable frequency filter 61 according to the first embodiment are achieved.

The configurations of the variable frequency filters described in the above embodiments may be appropriately combined for usage.

Figure 11:
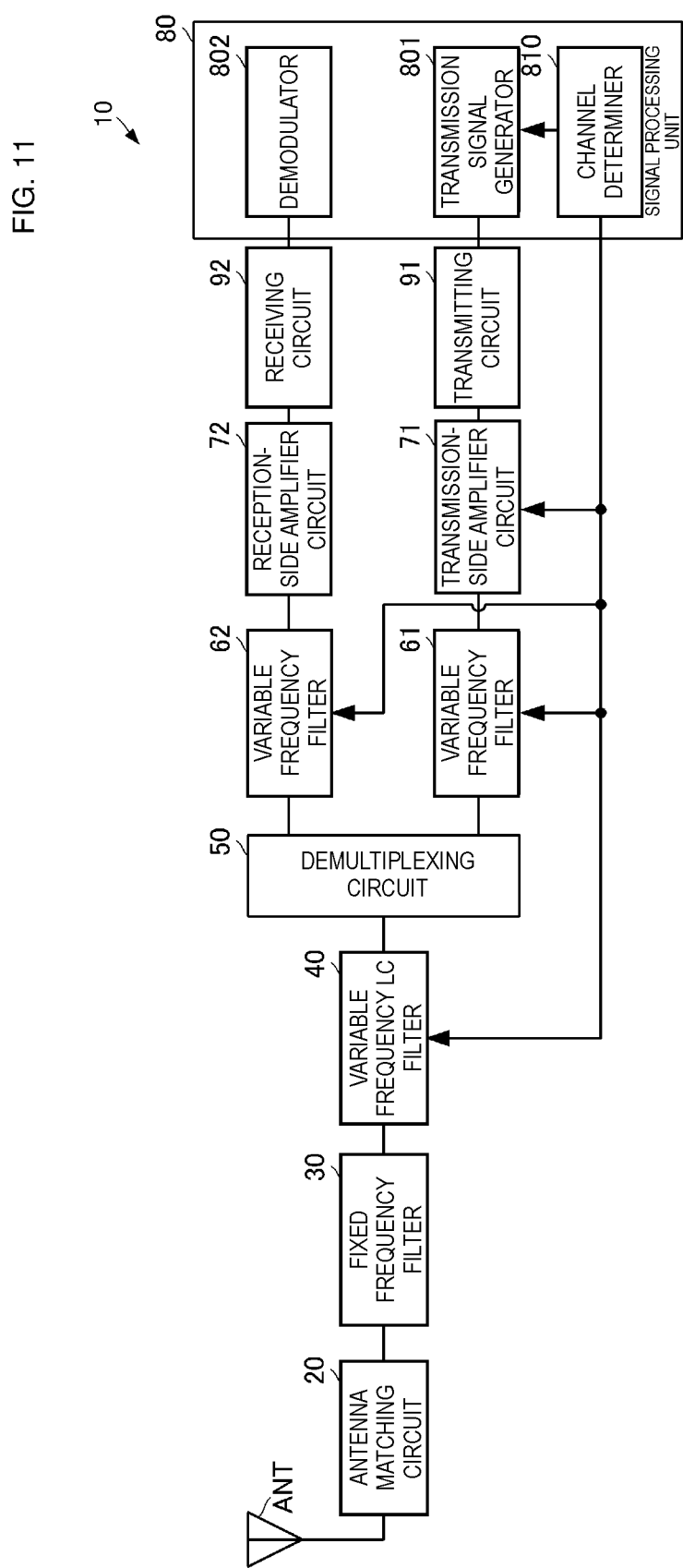
FIG. 11 is a functional block diagram of a high-frequency front end circuit according to an embodiment of the present disclosure.

Each of the variable frequency filters having the above configurations is capable of being used in a high-frequency front end circuit described below. FIG. 11 is a functional block diagram of a high-frequency front end circuit according to an embodiment of the present disclosure.

A high-frequency front end circuit 10 includes an antenna ANT, an antenna matching circuit 20, a fixed frequency filter 30, a variable frequency LC filter 40, a demultiplexing circuit 50, variable frequency filters 61 and 62, a transmission-side amplifier circuit 71, a reception-side amplifier circuit 72, a signal processing unit 80, a transmitting circuit 91, and a receiving circuit 92. The signal processing unit 80 includes a transmission signal generator 801, a demodulator 802, and a channel determiner 810. The fixed frequency filter 30 corresponds to a "fixed filter" of the present disclosure. The variable frequency LC filter 40 corresponds to a "second variable filter" of the present disclosure. The variable frequency filters 61 and 62 correspond to a "variable filter" of the present disclosure. The high-frequency front end circuit 10 may at least include the fixed frequency filter 30, the variable frequency LC filter 40, and the variable frequency filter 61. In this case, the fixed frequency filter 30, the variable frequency LC filter 40, and the variable frequency filter 61 are connected in series to each other in this order. Part or all of the demultiplexing circuit 50, the variable frequency filter 62, the transmission-side amplifier circuit 71, the reception-side amplifier circuit 72, the signal processing unit 80, the transmitting circuit 91, and the receiving circuit 92 may be omitted.

The antenna ANT is connected to the antenna matching circuit 20. The antenna matching circuit 20 is connected to the fixed frequency filter 30. The fixed frequency filter 30 is connected to the variable frequency LC filter 40. The variable frequency LC filter 40 is connected to an antenna-side terminal of the demultiplexing circuit 50. A transmission-side terminal of the demultiplexing circuit 50 is connected to the variable frequency filter 61. The variable frequency filter 61 is connected to the transmission-side amplifier circuit 71. The transmission-side amplifier circuit 71 is connected to the transmitting circuit 91. The transmitting circuit 91 is connected to the transmission signal generator 801 in the signal processing unit 80. A reception-side terminal of the demultiplexing circuit 50 is connected to the variable frequency filter 62. The variable frequency filter 62 is connected to the reception-side amplifier circuit 72. The reception-side amplifier circuit 72 is connected to the receiving circuit 92. The receiving circuit 92 is connected to the demodulator 802 in the signal processing unit 80.

The high-frequency front end circuit 10 transmits and receives high-frequency signals using a free communication channel in a communication band composed of multiple communication channels. For example, the high-frequency front end circuit 10 transmits and receives the high-frequency signals based on a television (TV) white space standard. In the TV white space standard, among the multiple communication channels which are set in an ultra-high frequency (UHF) band of television broadcasting, that is, a communication band from 470 [MHz] to 790 [MHz] and each of which has a frequency band width of 6 [MHz], a channel on which television broadcast signals are not transmitted is used as the free communication channel.

Figure 12:
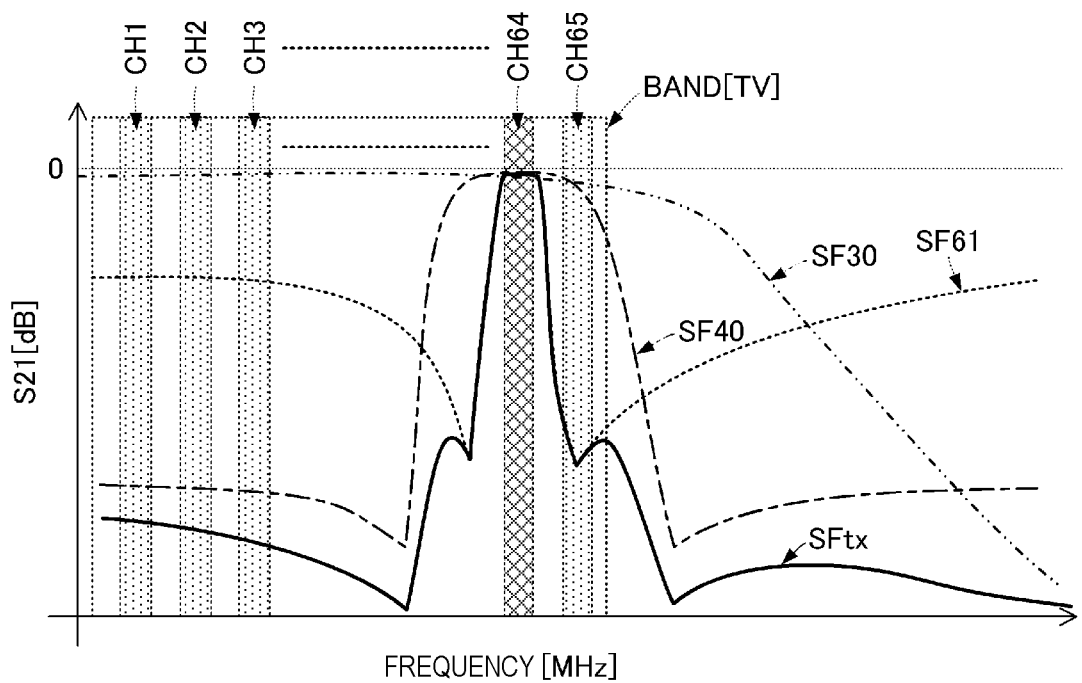
FIG. 12 is a diagram illustrating bandpass characteristics of the high-frequency front end circuit according to the embodiment of the present disclosure.

FIG. 12 is a diagram illustrating bandpass characteristics of the high-frequency front end circuit according to the embodiment of the present disclosure. The relationship between the communication band and each communication channel is illustrated in FIG. 12. A case is illustrated in FIG. 12 in which a communication channel CH64 is a selected channel (the free communication channel used for communication in the high-frequency front end circuit 10).

The antenna matching circuit 20 performs impedance matching between the antenna ANT and a circuit toward the signal processing unit 80 side from the fixed frequency filter 30. The antenna matching circuit 20 is composed of an inductor and a capacitor. For example, the element values of the inductor and the capacitor are set in the antenna matching circuit 20 so that the return loss of the antenna ANT is lower than or equal to a predetermined value in the entire communication band.

The fixed frequency filter 30 is composed of an inductor and a capacitor. In other words, the fixed frequency filter 30 is a fixed-frequency LC filter. The element values of the inductor and the capacitor are set in the fixed frequency filter 30 so that the frequency band of the communication band is within the pass band and the frequency band outside the communication band is within the attenuation band. For example, the fixed frequency filter 30 is composed of a low pass filter. As illustrated by a filter characteristic SF30 in FIG. 12, the frequency band of the communication band is within the pass band and the frequency band higher than the frequency band of the communication band is within the attenuation band in the fixed frequency filter 30. Accordingly, the fixed frequency filter 30 transmits a high-frequency signal within the communication band with low loss and attenuates a high-frequency signal outside the communication band.

The variable frequency LC filter 40 at least includes a variable capacitor and further includes at least one of an inductor and a capacitor. The variable frequency LC filter 40 is a band pass filter. A specific circuit configuration of the variable frequency LC filter 40 will be described below.

The variable frequency LC filter 40 varies the pass band and the attenuation band depending on the selected channel. Here, the frequency band of the selected channel is included in the pass band. As illustrated by a filter characteristic SF40 in FIG. 12, the frequency band width of the pass band of the variable frequency LC filter 40 is wider than the frequency band width of the selected channel. For example, the frequency band width of the pass band of the variable frequency LC filter 40 is about ten times wider than the frequency band width of the selected channel.

The variable frequency LC filter 40 has the attenuation poles on both sides of the pass band on the frequency axis. As illustrated by the filter characteristic SF40 in FIG. 12, the frequency band in which the attenuation is greatly decreased does not exist in the attenuation band of the variable frequency LC filter 40 and a certain attenuation is achieved at any frequency within the communication band outside the pass band.

Accordingly, the variable frequency LC filter 40 transmits a high-frequency signal in the frequency band corresponding to multiple channels including the selected channel with low loss and attenuates a high-frequency signal in the other frequency bands. Consequently, the variable frequency LC filter 40 is capable of attenuating spurious waves existing at frequencies apart from the frequency of the selected channel within the communication band. In particular, since the variable frequency LC filter 40 is capable of widening the frequency range of the attenuation band, compared with the frequency ranges of the attenuation bands of the variable frequency filters 61 and 62 using resonators described below, the variable frequency LC filter 40 is effective for attenuating intermodulation distortion (IMD), which is varied with the used communication channel (the selected channel) and which may occur in a wide frequency band within the communication band.

The demultiplexing circuit 50 is composed of, for example, a circulator or a duplexer. The demultiplexing circuit 50 outputs a transmission signal (high-frequency signal) input through the transmission-side terminal to the antenna-side terminal and outputs a reception signal (high-frequency signal) input through the antenna-side terminal to the reception-side terminal.

Each of the variable frequency filters 61 and 62 at least includes a piezoelectric resonator and a variable capacitor and further includes at least one of an inductor and a capacitor depending on the filter characteristics. In other words, each of the variable frequency filters 61 and 62 is a piezoelectric resonator filter of a variable frequency type. Each of the variable frequency filters 61 and 62 is a band pass filter using the resonance point and the anti-resonance point of the piezoelectric resonator. Specific circuit configurations of the variable frequency filters 61 and 62 will be described below. Since the basic configuration of the variable frequency filter 61 is the same as that of the variable frequency filter 62, the variable frequency filter 61 will now be described.

The variable frequency filter 61 varies the pass band and the attenuation band depending on the selected channel. Here, the frequency band of the selected channel is included in the pass band. As illustrated by a filter characteristic SF61 in FIG. 12, the frequency band width of the pass band of the variable frequency filter 61 is substantially the same as the frequency band width of the selected channel.

The variable frequency filter 61 has the attenuation poles on both sides of the pass band on the frequency axis. Since the variable frequency filter 61 is a piezoelectric resonator filter, the attenuation characteristic of the pass band of the variable frequency filter 61 is sharper than that of the LC filter, as illustrated by the filter characteristic SF61 in FIG. 12.

Accordingly, the variable frequency filter 61 transmits a high-frequency signal in the selected channel with low loss and attenuates a high-frequency signal in an adjacent communication channel.

The circuit configuration described in each embodiment described above is applied to the variable frequency filter 61.

As illustrated by the filter characteristic SF61 in FIG. 12, the attenuation band of the variable frequency filter 61 has frequency bands which are opposite to the pass band with respect to the attenuation pole and in which the attenuation is decreased. However, since the variable frequency filter 61, the variable frequency LC filter 40, and the fixed frequency filter 30 are connected in series to each other on the transmission path of the high-frequency signal, sufficient attenuation is achieved with the variable frequency LC filter 40 and the fixed frequency filter 30 even in the frequency band in which the attenuation is not achieved with the variable frequency filter 61.

Accordingly, as illustrated by a filter characteristic SFtx in FIG. 12, a high-frequency signal in the selected channel is capable of being transmitted with low loss and a high-frequency signal in the frequency bands other than the selected channel, including the adjacent channel, is capable of being attenuated. Similar effects and advantages are achieved even if the selected channel is switched.

The transmission-side amplifier circuit 71 includes an amplifier element. A specific circuit configuration of the transmission-side amplifier circuit 71 will be described below. The transmission-side amplifier circuit 71 amplifies the transmission signal generated by the transmission signal generator 801 and supplies the amplified signal to the variable frequency filter 61. The reception-side amplifier circuit 72 includes a so-called low noise amplifier (LNA). The reception-side amplifier circuit 72 amplifies the reception signal supplied from the variable frequency filter 62 and supplies the amplified signal to the demodulator 802.

The channel determiner 810 in the signal processing unit 80 detects the free communication channel within the communication band. For example, the channel determiner 810 externally acquires a map of free channels to detect the free channel based on the map. The channel determiner 810 selects at least one free communication channel and sets the selected channel as the selected channel. The channel determiner 810 supplies the selected channel to the transmission signal generator 801. The transmission signal generator 801 generates the transmission signal using the high-frequency signal having the frequency of the selected channel and supplies the generated transmission signal to the transmission-side amplifier circuit 71. The channel determiner 810 supplies the selected channel to the demodulator 802 although this is not illustrated in FIG. 11. The demodulator 802 demodulates the reception signal with a local signal based on the selected channel.

The channel determiner 810 also supplies the selected channel to the variable frequency LC filter 40, the transmission-side amplifier circuit 71, the variable frequency filter 61, and the variable frequency filter 62. The variable frequency LC filter 40, the variable frequency filter 61, and the variable frequency filter 62 realize the above filter characteristics using the selected channel. The transmission-side amplifier circuit 71 amplifies the transmission signal using the selected channel.

As described above, the use of the configuration of the high-frequency front end circuit 10 of the present embodiment enables wireless communication with low loss to be realized using the selected channel when the wireless communication is performed using the selected communication channel (the selected channel) in the communication band composed of the multiple communication channels.

The communication channel may be determined using the following method. The high-frequency front end circuit includes a detecting unit. The detecting unit may be connected to the antenna ANT side of the demultiplexing circuit 50 or may be connected to another antenna for detecting a reception level. When multiple free communication channels exist, the detecting unit detects the reception level of each of the multiple free communication channels. The detecting unit supplies the respective reception levels to the channel determiner 810. The channel determiner 810 selects the free communication channel having the highest reception level, among the detected multiple reception levels, as the communication channel.

Figure 13:
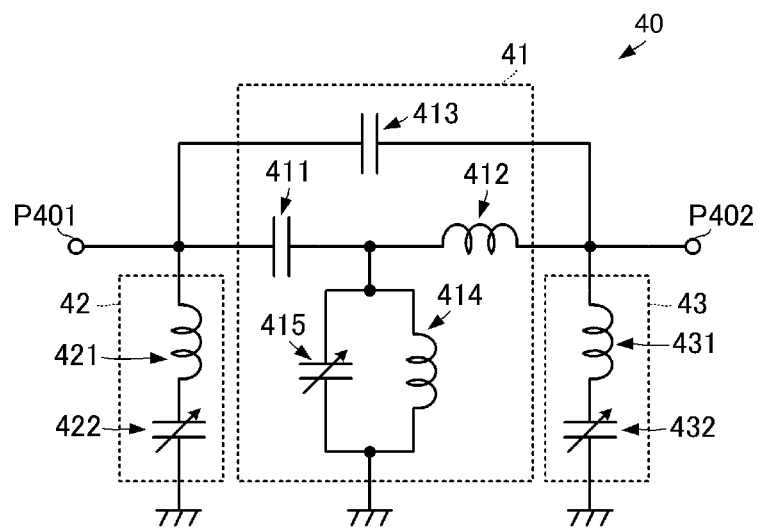
FIG. 13 is a circuit diagram of a variable frequency LC filter according to an embodiment of the present disclosure.

A specific configuration of the variable frequency LC filter will now be described. FIG. 13 is a circuit diagram of the variable frequency LC filter according to an embodiment of the present disclosure.

The variable frequency LC filter 40 includes a first series arm LC filter circuit 41, a first parallel arm LC filter circuit 42, a second parallel arm LC filter circuit 43, and connection terminals P401 and P402.

The first series arm LC filter circuit 41 is connected between the connection terminal P401 and the connection terminal P402. The first parallel arm LC filter circuit 42 is connected between the connection terminal P401 side of the first parallel arm LC filter circuit 41 and the ground potential. The second parallel arm LC filter circuit 43 is connected between the connection terminal P402 side of the first series arm LC filter circuit 41 and the ground potential.

The first series arm LC filter circuit 41 includes capacitors 411 and 413, inductors 412 and 414, and a variable capacitor 415. The capacitor 411 and the inductor 412 are connected in series between the connection terminals P401 and P402. The inductor 412 is directly connected to the connection terminal P402. The capacitor 413 is connected in parallel to the series resonant circuit composed of the capacitor 411 and the inductor 412. The inductor 414 and the variable capacitor 415 are connected in parallel to each other. This parallel resonant circuit is connected between a node between the capacitor 411 and the inductor 412 and the ground potential.

The first parallel arm LC filter circuit 42 includes an inductor 421 and a variable capacitor 422. A series resonant circuit composed of the inductor 421 and the variable capacitor 422 is connected between the connection terminal P401 side of the first series arm LC filter circuit 41 and the ground potential.

The second parallel arm LC filter circuit 43 includes an inductor 431 and a variable capacitor 432. A series resonant circuit composed of the inductor 431 and the variable capacitor 432 is connected between the connection terminal P402 side of the first series arm LC filter circuit 41 and the ground potential.

Figure 14:
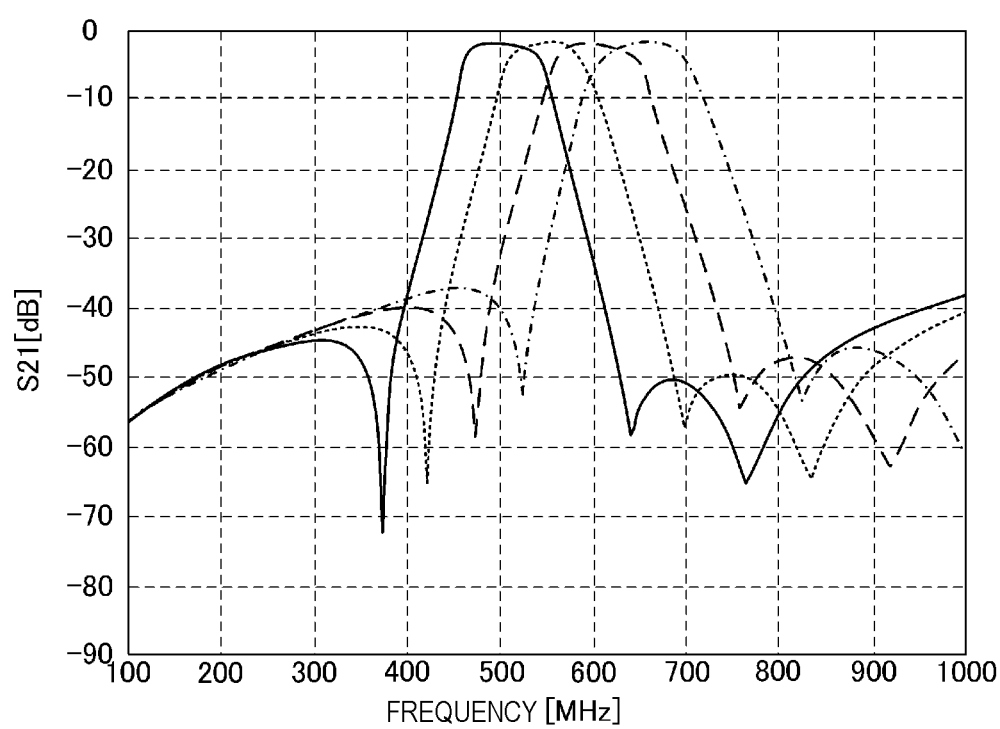
FIG. 14 is a graph illustrating bandpass characteristics of the variable frequency LC filter illustrated in FIG. 13.

In such a configuration, varying the capacitances of the variable capacitors 415, 422, and 432 realizes the band pass filter the pass band of which is varied. FIG. 14 is a graph illustrating bandpass characteristics of the variable frequency LC filter illustrated in FIG. 13. As illustrated in FIG. 14, the use of the variable frequency LC filter 40 realizes the filter characteristics in which the pass band width is about 100 [MHz] and which has the attenuation poles on both sides of the pass band. In particular, the connection of the inductor 412 in the first series arm LC filter circuit 41 to the connection terminal P402 with no capacitor interposed therebetween, as illustrated in FIG. 13, enables the attenuation characteristics to be sharp. In other words, the direct connection of the inductor 412 in the first series arm LC filter circuit 41 to the connection terminal P402 or connection of the inductor 412 in the first series arm LC filter circuit 41 to the connection terminal P402 with another inductor interposed therebetween enables the attenuation characteristics to be sharp.

It is considered that this is for the following reasons:

Since the capacitor that is directly connected to the inductor has frequency characteristics in which low frequencies are attenuated and high frequencies are transmitted, that is, characteristics of a high pass filter, the capacitor that is directly connected to the inductor may cause degradation of the attenuation at the high frequencies.

Since the inductor that is directly connected to the connection terminal has frequency characteristics in which high frequencies are attenuated and low frequencies are transmitted, that is, characteristics of a low pass filter, the inductor that is directly connected to the connection terminal may cause improvement of the attenuation at the high frequencies.

In addition, when the inductor is connected to the connection terminal with another inductor disposed therebetween, such connection may cause further improvement of the attenuation at the high frequencies.

REFERENCE SIGNS LIST

10 high-frequency front end circuit
20 antenna matching circuit
30 fixed frequency filter
40 variable frequency LC filter
41 first series arm LC filter circuit
42 first parallel arm LC filter circuit
43 second parallel arm LC filter circuit
50 demultiplexing circuit
61, 62, 61A, 61B, 61C variable frequency filter
71 transmission-side amplifier circuit
72 reception-side amplifier circuit
80 signal processing unit 411, 413 capacitor
412, 414, 421, 431, 612, 622, 632, 6121, 6122, 6221, 6222, 6321, 6322 inductor
415, 422, 432, 613, 623, 623A, 623B, 633 variable capacitor
601, 601B, 601C series arm resonant circuit
602, 602A, 602B first parallel arm resonant circuit
603, 603A, 603B second parallel arm resonant circuit
610, 6101, 6102 characteristic adjusting capacitor
611 piezoelectric resonator
614, 624, 634 switch
621, 631 piezoelectric resonator
801 transmission signal generator
802 demodulator
810 channel determiner
ANT antenna
P401, P402 connection terminal
P601 first connection terminal
P602 second connection terminal

The invention claimed is:

1. A variable frequency filter comprising:
an input terminal;
an output terminal;
a series arm resonant circuit comprising:
  a fixed capacitor having a fixed capacitance, and
  a variable capacitor, an inductor, and an elastic wave resonator connected in parallel with each other,
  wherein a first end of the series arm resonant circuit is connected to the input terminal and a second end of the series arm is connected to the output terminal;
a first parallel arm resonant circuit having one end connected to the first end of the series arm resonant circuit and another end connected to ground; and
a second parallel arm resonant circuit having one end connected to the second end of the series arm resonant circuit and another end connected to ground,
wherein the first parallel arm resonant circuit and the second parallel arm resonant circuit each comprise a variable capacitor, an inductor, and an elastic wave resonator connected in series with each other, and
wherein the fixed capacitor is connected to an end of the series arm resonant circuit that is connected to the parallel arm resonant circuit comprising the elastic wave resonator having the lowest impedance.

2. The variable frequency filter according to claim 1, wherein the fixed capacitor is connected to the first end of the series arm resonant circuit.

3. The variable frequency filter according to claim 2, further comprising a second fixed capacitor connected to the second end of the series arm resonant circuit.

4. The variable frequency filter according to claim 3, wherein the capacitance of the fixed capacitor is lower than capacitance of the second fixed capacitor.

5. The variable frequency filter according to claim 1, further comprising:
a second fixed capacitor,
wherein the second fixed capacitor is connected to an end of the series arm resonant circuit that is connected to the parallel arm resonant circuit comprising the elastic wave resonator having the highest impedance, and
wherein the capacitance of the fixed capacitor is lower than capacitance of the second fixed capacitor.

6. The variable frequency filter according to claim 1, wherein the variable capacitor of the first parallel arm resonant circuit and the variable capacitor of the second parallel arm resonant circuit are embodied as a single common variable capacitor.

7. The variable frequency filter according to claim 1,
wherein the first parallel arm resonant circuit comprises a plurality of inductors or a transmission line selectively connected to be in series with the elastic wave resonator and the variable capacitor of the first parallel arm resonant circuit,
wherein the second parallel arm resonant circuit comprises a plurality of inductors or a transmission line selectively connected to be in series with the elastic wave resonator and the variable capacitor of the second parallel arm resonant circuit, and
wherein the series arm resonant circuit comprises a plurality of inductors or a transmission line selectively connected to be in parallel with the elastic wave resonator and the variable capacitor of the series arm resonant circuit.

8. A high-frequency front end circuit configured to select a used channel from free communication channels in a communication band within a frequency band used in a wireless communication system, the high-frequency front end circuit comprising:
the variable frequency filter according to claim 1, the variable frequency filter being configured to attenuate a high-frequency signal of spurious waves, the spurious waves being varied with the used channel and being within the frequency band; and
a fixed filter configured to attenuate a high-frequency signal outside the frequency band.

9. The high-frequency front end circuit according to claim 8, further comprising:
a second variable LC filter configured to attenuate intermodulation distortion within the frequency band,
wherein the second variable filter comprises:
  an input terminal;
  an output terminal;
  a first series arm LC filter circuit comprising:
    an LC series circuit having a first fixed capacitor and a first inductor connected in series with each other, a first end of the LC series circuit being connected to the input terminal and a second end of the LC series circuit being connected to the output terminal, a second fixed capacitor connected in parallel with the LC series circuit, and
    an LC parallel circuit having a variable capacitor and a second inductor connected in parallel with each other;
  a first parallel arm LC filter circuit having one end connected to the first end of the LC series circuit and another end connected to ground; and
  a second parallel arm LC filter circuit having one end connected to the second end of the LC series circuit and another end connected to ground,
wherein the first parallel arm LC filter circuit and the second parallel arm LC filter circuit each comprise a variable capacitor and an inductor connected in series with each other, and
wherein the first inductor is directly connected to the output terminal or is connected to the output terminal with another inductor interposed therebetween.

10. The high-frequency front end circuit according to claim 8, further comprising:
a detecting unit that, when there are a plurality of free communication channels, detects a reception level of each of the plurality of free communication channels; and a determining unit that selects the free communication channel having a highest reception level as the used channel.

* * * * *